United States Patent Office 3,338,765

Patented Aug. 29, 1967

3,338,765
ETCHING BISMUTH TELLURIDE

Laurence H. Weitzman, North Huntingdon Township, Pa., assignor to Westinghouse Electric Corporation, East Pittsburgh, Pa., a corporation of Pennsylvania No Drawing. Filed Sept. 9, 1963, Ser. No. 307,368
2 Claims. (Cl. 156—3)

This invention relates to thermoelectric devices and in particular to a process for affixing electrical contacts to thermoelectric materials.

In the fabrication of thermoelectric devices for use in refrigeration and power generation applications using bismuth telluride as the basic material it is necessary to join electrically conductive contacts to the bismuth telluride thermoelectrical material.

One method of joining electrical contacts to the bismuth telluride is by coating the bismuth telluride with a metal electrical conductor, for example, nickel. A problem encountered in the process of coating the bismuth telluride with a metal electrical conductor has been poor mechanical adhesion between the bismuth telluride surface and the metallic coating which is being applied to this surface.

Despite the use of different methods of coating the bismuth telluride, such as electroplating or spraying metal powders at high temperatures onto its surface, a high percentage of breakage between the metal coating and the bismuth telluride surface has been observed.

Accordingly, an object of this invention is to provide for an improved mechanical strength in the bonding between an electrical contact and a thermoelectric pellet.

Another object is to provide a process for affixing an elecrically conductive metal to a bismuth telluride thermoelectric pellet.

Other objects will, in part, be obvious and will, in part, appear hereinafter.

The present invention accomplishes the above-cited objects by providing a chemical process for treating the surface of a bismuth telluride thermoelectric pellet prior to applying an electrically conductive metal coating to the surface.

More specifically, the chemical process consists of etching the bismuth telluride surface in a solution containing a mixture of two or more acids prior to affixing an electrically conductive metal to the bismuth telluride surface.

The present invention may be better understood by reference to the following description.

In fabricating a thermoelectric couple for power generation or refrigeration purposes it is necessary to electrically connect thermoelectric pellets of different type conductivity. That is, a P-type pellet is connected electrically to an N-type pellet to form a thermoelectric couple.

The bismuth telluride pellet used as a starting material may be in the geometrical shape of a cube, a rectangle, a cylinder, or any other suitable shape known to those skilled in the art.

It has been found that by etching the surface of a bismuth telluride pellet in an acidic solution prior to applying an electrically conductive metal coating increases the adhesion between the surface and the metal coating. It is believed this increase in adhesion is caused by the reaction between the surface of the bismuth telluride and the acid etchant. That is, the acid in acting upon the surface roughens it thereby increasing the area of the surface and permits the metallic coating to adhere with a higher degree of mechanical strength than would be obtainable if the surface were not etched in the acidic solution, or if the surface was mechanically roughened.

As an example, a cubic shaped P-type pellet of pressed and annealed bismuth telluride was masked on four sides with an acid resistant coating, leaving the top and bottom sides or surfaces exposed. Then the masked pellet was immersed in a solution containing, by volume, three parts concentrated nitric acid, two parts concentrated hydrofluoric acid and two parts glacial acetic acid, until a roughening of the unmasked surface was observed by visual inspection.

In this case, roughening of the surface was observed after the pellet was in the solution for about 15 seconds, generally the roughening which occurs is the removal of about four mils of material from the surface of the pellet.

The pellet was then removed from the etching solution and rinsed in water. Then the pellet was used as the cathode in a nickel sulfamate solution, with a sheet of nickel as the anode. A current was passed through the solution and a coating of nickel was deposited onto the exposed top and bottom surfaces of the pellet.

For purposes of comparison, attention is directed to Table I which shows a comparison of the tensile strength of the nickel coating to P-type bismuth telluride pelllets.

Twelve P-type pressed and annealed bismuth telluride pellets of the same geometric shape and having same dimensions were used as samples. Table I shows data for six samples which were coated with nickel after the surface was roughened by sandblasting.

*Table I.—Sandblasted and* Ni *sprayed P-type bismuth telluride pellets*

| | P.s.i. at which joint broke |
|---|---|
| No. 1 | 382 |
| No. 2 | 451 |
| No. 3 | 399 |
| No. 4 | 278 |
| No. 5 | 278 |
| No. 6 | 313 |

Table II shows data for examples which were etched in the above-described etchant prior to coating with nickel.

*Table II.—Etched and* Ni *sprayed P-type bismuth telluride pellets*

| | P.s.i. at which joint broke |
|---|---|
| No. 1 | 1042 |
| No. 2 | 1250 |
| No. 3 | 1545 |
| No. 4 | 1285 |
| No. 5 | 1458 |
| No. 6 | 1128 |

As can be seen from the comparison of the tensile strengths, the adhesion between the nickel coating and the etched P-type bismuth telluride treated in accordance with the teaching of this invention is four times greater than the bismuth telluride which was sandblasted prior to coating with nickel.

Another example, cylindrically shaped N-type bismuth telluride pellets produced by the Bridgeman Furnace technique were used as the starting material. Each pellet was masked on the curved cylindrical surface with an acid resistant coating leaving the two ends of the pellet exposed. The pellet was then immersed in a solution containing one part concentrated hydrochloric acid and one part concentrated nitric acid until a roughening of the surface was observed by visual inspection. The pellet was then rinsed in a solution of glacial acetic acid, in order to clean the surface.

In this case the roughening occurred about two and one-quarter minutes after the pellet was immersed in the solution. The roughening which is observable with the naked eye is actually a reaction between the acidic solution and the bismuth telluride, in which generally about 4 mils of the surface is removed by the reaction. Then the etched pellet was placed in an electrolytic solution where nickel was plated onto the etched surfaces in the manner described above.

For the purpose of comparing the improvement in the adherence of the nickel coating to the bismuth telluride surface, attention is directed to the following tables of experimental data.

Table III shows the tensile strength of nickel coating on the top or bottom flat surface of a cylindrically shaped N-type bismuth telluride pellet prepared by the Bridgeman Furnace technique whose surface was mechanically roughened by sandblasting prior to coating with nickel in an electrolytic bath.

*Table III.—Sandblasted and* Ni *sprayed N-type bismuth telluride pellets*

| | P.s.i. at which joint broke |
|---|---|
| No. 1 | 608 |
| No. 2 | 451 |
| No. 3 | 642 |
| No. 4 | 851 |
| No. 5 | 974 |
| No. 6 | 521 |

Table IV shows data on the tensile strength of the nickel coating to N-type bismuth telluride pellets, of the same geometrical shape and size as those pellets in Table III which were treated in accordance with the teaching of this invention.

*Table IV.—Etched and* Ni *sprayed N-type bismuth telluride pellets*

| | P.s.i. at which joint broke |
|---|---|
| No. 1 | 1667 |
| No. 2 | 1649 |
| No. 3 | 1372 |
| No. 4 | 1458 |
| No. 5 | 1788 |

As can be seen from a comparison of Table III with Table IV, the adherence between the nickel coating and N-type bismuth telluride, measured in tensile strength, is about two and one-half times greater for the pellets treated in accordance with the teachings of this invention.

While it has been demonstrated in the examples, the plating of nickel onto the surface of the bismuth telluride pellet, from an electrolytic solution, it should be understood that other suitable electrically conductive metals may also be plated onto the prepared surface. Nickel as well as other metals may also be affixed to the prepared surface by high speed spraying of the fine powders onto the surface.

While the invention has been described with reference to particular embodiments and examples, it will be understood, of course, that modifications, substitutions and the like may be made therein without departing from its scope.

I claim as my invention:

1. In the process of joining metal electrical contacts to a p-type bismuth telluride thermoelectric pellet which includes the steps of applying an electrically conductive metal coating of nickel to at least a portion of at least one surface of said p-type bismuth telluride thermoelectric pellet, the improvement comprising etching at least that portion of the surface of said p-type bismuth telluride pellet to which said electrical contact is to be affixed with a solution consisting essentially of, by volume, two parts hydrochloric acid, three parts nitric acid and two parts acetic acid prior to applying said nickel to said p-type bismuth telluride pellet.

2. In a process of joining metal electrical contacts to an n-type bismuth telluride thermoelectric pellet which includes the steps of applying an electrictrically conductive metal coating of nickel to at least a portion of the surface of said n-type bismuth telluride thermoelectric pellet, the improvement comprising; etching at least that portion of the surface of said n-type bismuth telluride pellet to which said electrical contact is to be affixed with a solution consisting essentially of, by volume, one part hydrochloric acid and one part nitric acid prior to applying said nickel coating to said n-type bismuth telluride pellet.

References Cited

UNITED STATES PATENTS

| | | | |
|---|---|---|---|
| 2,822,299 | 2/1958 | De Nobel | 156—17 X |
| 2,894,884 | 7/1959 | Gray | 204—49 X |

OTHER REFERENCES

Bismuth Telluride and Related Compounds, by Wright Research, London, vol. 12 (1959), pp. 300–15.

Thermoelectric Materials and Devices, Chadoff, I. B., et al., Reinhold Pub. Co., Oct. 6, 1960, TK 2950C3, pp. 156–159.

JACOB STEINBERG, *Primary Examiner.*